United States Patent
Pierson et al.

(10) Patent No.: US 9,895,020 B2
(45) Date of Patent: Feb. 20, 2018

(54) COOKING DEVICE COMPRISING A COOKING SURFACE THAT IS EASY TO CLEAN AND RESISTANT TO SCRATCHING

(71) Applicants: SEB S.A., Ecully (FR); Universite de Lorraine, Nancy (FR); Centre National De La Recherche Scientifique, Paris (FR)

(72) Inventors: Jean-Francois Pierson, Vincey (FR); Simon Allemand, Rumilly (FR); Mickaël Meyer, Rumilly (FR); Stephane Tuffe, Cognin (FR)

(73) Assignee: SEB S.A., Ecully (FR)

( * ) Notice: Subject to any disclaimer, the term of this patent is extended or adjusted under 35 U.S.C. 154(b) by 0 days.

(21) Appl. No.: 14/646,904

(22) PCT Filed: Nov. 22, 2013

(86) PCT No.: PCT/EP2013/074505
§ 371 (c)(1),
(2) Date: May 22, 2015

(87) PCT Pub. No.: WO2014/079981
PCT Pub. Date: May 30, 2014

(65) Prior Publication Data
US 2015/0297025 A1   Oct. 22, 2015

(30) Foreign Application Priority Data
Nov. 26, 2012  (FR) ..................... 12 61228

(51) Int. Cl.
*C23C 14/06*   (2006.01)
*A47J 36/02*   (2006.01)
(Continued)

(52) U.S. Cl.
CPC ............. *A47J 36/025* (2013.01); *A47J 36/02* (2013.01); *A47J 36/04* (2013.01); *C23C 14/067* (2013.01); *C23C 14/35* (2013.01); *C23C 16/50* (2013.01)

(58) Field of Classification Search
USPC ....... 220/573.1, 573.2; 427/255.28, 255.391, 427/255; 204/192.15, 192.16, 192;
(Continued)

(56) References Cited

U.S. PATENT DOCUMENTS 4,209,877 A * 7/1980 Colasent ................. A47J 45/08
                                                      220/753
4,239,536 A * 12/1980 Yamamoto ............ C23C 16/30
                                                      419/15
(Continued)

FOREIGN PATENT DOCUMENTS

CN   1342051      3/2002
CN   1751135 A    3/2006
(Continued)

*Primary Examiner* — Archene Turner
(74) *Attorney, Agent, or Firm* — The Webb Law Firm

(57) ABSTRACT

The present invention relates to a cooking device including a metal holder supporting a ceramic cooking surface, the holder having a hardness no lower than 150 HV. The holder forms a substrate supporting a surface layer made of a transition metal boride or boronitride forming the cooking surface. The present invention further relates to a culinary article including a cooking device of the type above-mentioned, a household cooking appliance including a cooking device of the type above-mentioned, as well as a method for producing a cooking device of the type above-mentioned.

20 Claims, 1 Drawing Sheet

(51) Int. Cl.
   *A47J 36/04* (2006.01)
   *C23C 14/35* (2006.01)
   *C23C 16/50* (2006.01)

(58) Field of Classification Search
   USPC .................. 428/336, 469, 472, 698, 704
   See application file for complete search history.

(56) References Cited

U.S. PATENT DOCUMENTS

| | | | | |
|---|---|---|---|---|
| 5,364,522 | A * | 11/1994 | Wang | C25D 9/04 428/698 |
| 5,387,475 | A * | 2/1995 | Baresel | C03C 8/14 428/469 |
| 5,447,803 | A * | 9/1995 | Nagaoka | A47J 36/02 204/192.11 |
| 6,360,423 | B1 * | 3/2002 | Groll | A47J 36/02 220/573.1 |
| 7,267,701 | B2 * | 9/2007 | Holzschuh | C23C 28/044 428/336 |
| 2002/0092585 | A1 * | 7/2002 | Savich | C23C 8/02 148/518 |
| 2011/0045283 | A1 * | 2/2011 | Holzschuh | C23C 16/56 428/336 |
| 2011/0198358 | A1 * | 8/2011 | Parent | A47J 36/02 220/573.1 |
| 2011/0262233 | A1 * | 10/2011 | Martensson | C23C 16/0272 427/255.15 |

FOREIGN PATENT DOCUMENTS

| | | |
|---|---|---|
| CN | 101333657 A | 12/2008 |
| CN | 102378830 A | 3/2012 |
| DE | 202006002366 U1 | 5/2006 |
| EP | 0004177 A1 | 3/1979 |
| JP | 60-014831 * | 1/1985 |
| WO | 2005078044 A1 | 8/2005 |
| WO | 2007093261 A1 | 8/2007 |

* cited by examiner

COOKING DEVICE COMPRISING A COOKING SURFACE THAT IS EASY TO CLEAN AND RESISTANT TO SCRATCHING

CROSS-REFERENCE TO RELATED APPLICATIONS

This application is the United States national phase of International Application No. PCT/EP2013/074505 filed Nov. 22, 2013, and claims priority to French Patent Application No. 1261228 filed Nov. 26, 2012, the disclosures of which are hereby incorporated in their entirety by reference.

BACKGROUND OF THE INVENTION

Field of the Invention

This invention falls in the technical field of cooking surfaces used in culinary articles or in electrical heating appliances.

More specifically, this invention relates to cooking devices comprising a cooking surface that could be exposed to cutting and/or hard tools, such as, in particular, knives, forks and spatulas.

Description of Related Art

Known art is to manufacture cooking devices with stainless steel cooking surface. However, certain food sticks to these surfaces during cooking and cutting and/or hard tools can scratch these surfaces.

The use of transition metal nitride deposits improves the scratch resistance of cooking surfaces; however, some foods, such as potatoes and fish, often stick to these cooking surface coatings.

SUMMARY OF THE INVENTION

One objective of this invention is to offer a cooking device comprising a cooking surface that limits or prevents food from sticking during cooking and that is easy to clean.

Another objective of this invention is to offer a cooking device comprising a cooking surface that limits or prevents food from sticking during cooking and that remains easy to clean despite repeated use.

Another objective of this invention is to offer a cooking device comprising a cooking surface that limits or prevents food from sticking during cooking that has superior scratch resistance compared to a stainless steel cooking surface.

Another objective of this invention is to offer a culinary article or household cooking appliance comprising a device of the aforementioned type.

Another objective of this invention is to offer a process to manufacture a cooking device comprising a cooking surface that limits or prevents food from sticking during cooking and that is easy to clean.

Another objective of this invention is to offer a process to manufacture a cooking device comprising a cooking surface that limits or prevents food from sticking during cooking and that remains easy to clean despite repeated use.

Another objective of this invention is to offer a process for manufacturing a cooking device comprising a cooking surface that limits or prevents food from sticking during cooking and that has superior scratch resistance compared to a stainless steel cooking surface.

These objectives are achieved with a cooking device with a metal holder supporting a ceramic cooking surface where the holder has a hardness greater than or equal to 150 HV and where the holder forms a substrate supporting a surface layer of boride or transition metal boronitride forming the cooking surface. Transition metal boride surface layers are known for their properties of great hardness, resistance to wear and tear and thermal stability. Testing has shown that such surface layers are also surprisingly resistant to food sticking and are easier to clean than stainless steel cooking surfaces. The properties of hardness of the substrate also improve the scratch resistance of the boride or transition metal boronitride surface layer.

In other words, the holder forms a substrate supporting a surface layer of boride or transition metal boronitride forming the cooking surface.

Advantageously, the surface layer is at least 2 µm thick, and preferably at least 3 µm. Such a layer will provide satisfactory scratch resistance.

In accordance with a preferred embodiment, the holder is made of stainless steel, titanium or a multilayered material with at least one external stainless steel face. If desired, a compound-material metallic holder, in particular, a multi-layered and/or metallic matrix composite, may be used.

In accordance with one embodiment, the surface layer is formed by a boride or transition metal boronitride coating. Advantageously, the surface layer thickness is between 2 and 10 µm, and preferably between 3 and 5 µm.

In other words, the surface layer consists of a transition metal boride or transition metal boronitride coating.

Advantageously, then, the transition metal used is titanium, chromium, zirconium, vanadium, niobium or iron.

In accordance with another embodiment, the surface layer is formed by an iron and/or titanium boride conversion layer, depending on the material used for the holder. Advantageously, the thickness of the surface layer is then between 10 and 300 µm.

In accordance with one advantageous embodiment, the holder has a face supporting the cooking surface and another face opposite said face. If desired, the holder may be manufactured by stamping and/or using sheet metal cutouts.

These objectives are also achieved with a culinary article comprising a cooking device with a metal holder with an internal and/or upper face forming a cooking surface and another exterior and/or lower face designed to be placed next to a heat source in which the cooking device is consistent with at least one of the foregoing characteristics.

These objectives are also achieved with a culinary article comprising a cooking device with a metal holder with an internal and/or upper face forming a cooking surface and another exterior and/or lower face of said appliance in which the cooking device is consistent with at least one of the foregoing characteristics.

These objectives are also achieved with a process to manufacture a cooking device that consists of the following steps:
  supply or manufacture of a metal holder with a hardness greater than or equal to 150 HV,
  addition of a boride or transition metal boronitride surface layer to one metal holder face in order to form a cooking surface.

In other words, these objectives are also achieved with a process to manufacture a cooking device which consists of the following steps:
  supply or manufacture of a metal holder with a hardness greater than or equal to 150 HV,
  addition of a transition metal boride or transition metal boronitride surface layer to one metal holder face in order to form a cooking surface.

Advantageously, then, the metal holder is made of stainless steel, titanium, or a multilayered material containing at least one external stainless steel face.

In accordance with one embodiment, the process consists of depositing a boride or transition metal boronitride coating on the metal holder face.

In other words, the process consists of depositing a transition metal boride or transition metal boronitride coating on the metal holder face.

Advantageously, then, the transition metal used is titanium, chromium, zirconium, vanadium, niobium or iron.

In accordance with one embodiment, the coating is created using physical vapor deposition on the metal holder face.

Then, in accordance with one preferred embodiment to achieve thick deposits which adhere to the substrate, the depositing is performed using direct current magnetron sputtering, preferably using pulsed direct current.

Alternatively, the coating could, in particular, be deposited using by cathodic arc evaporation on said metal holder face.

In accordance with another embodiment, the coating is deposited using plasma-assisted chemical vapor deposition on said metal holder face.

In accordance with another embodiment, the process consists of creating an iron or titanium boride conversion layer using thermo-chemical boride processing on said metal holder face.

BRIEF DESCRIPTION OF THE DRAWINGS

The invention will be better understood by examining two embodiments, which are not in any manner limitative, illustrated in the attached figures, in which.

DESCRIPTION OF THE INVENTION

Figure 1:
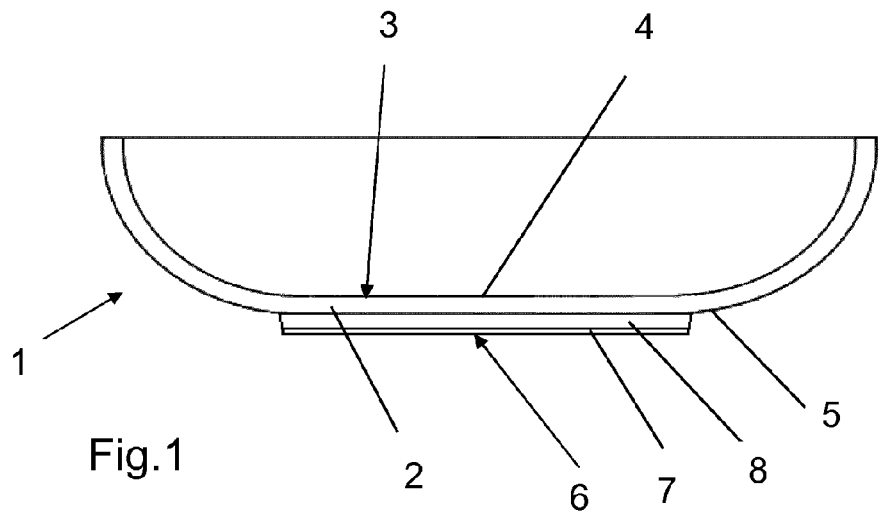
FIG. 1 is a schematic top and cross-section view of an initial example of an embodiment of a cooking device in accordance with the invention.
Figure 2:
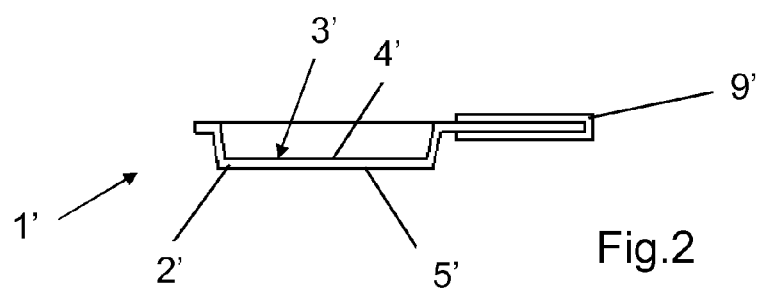
FIG. 2 is a schematic top and cross-section view of a second example of an embodiment of a cooking device in accordance with the invention.
Figure 3:
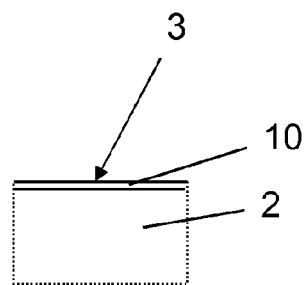
FIG. 3 is a schematic cross-section view of an initial embodiment of a cooking device in accordance with the invention.
Figure 4:
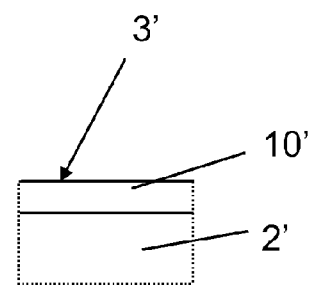
FIG. 4 is a schematic cross-section view of a second embodiment of a cooking device in accordance with the invention.

Cooking devices 1; 1' shown in FIGS. 1 and 2 comprises metallic holder 2; 2' supporting cooking surface 3; 3' ceramic. Holder 2; 2' may in particular, take the final form of a cooking receptacle or cooktop.

Specifically, holder 2; 2' comprises a metallic plate with face 4; 4' supporting cooking surface 3; 3' and another face 5; 5', opposite face 4; 4'.

As shown in FIGS. 1 and 2, cooking surface 3; 3' is concave and/or has a bottom surrounded by a lateral wall, face 4; 4' forms the internal face of holder 2; 2', and other face 5; 5' forms the external face of holder 2; 2'.

Cooking device 1; 1' may, in particular, form part of a cooking device and/or a household cooking appliance.

Cooking device 1 shown in FIG. 1 belongs to a culinary article. Internal and/or upper face 4 forms cooking surface 3 and other external and/or lower face 5 is designed to be placed next to a heat source. Such a culinary article may be, inter alia, a pan, casserole or wok; holder 2 forms a tank. If desired, one or more handles may be attached to cooking device 1 to create the culinary article.

Other face 5 may, if desired, have heat-diffusing bottom 6 designed to rest on a heat source. As shown in FIG. 1, cooking device 1 contains heat distribution wall 7, made of a good heat-conducting material, e.g., aluminum, located between other face 5 of holder 2 and lower wall 8, made of, for example, ferromagnetic stainless steel. Lower wall 8 and heat distribution wall 7 may, in particular, be assembled by hot stamping with holder 2.

Cooking device 1' shown in FIG. 2 may be part of a household cooking appliance such as a raclette maker. Holder 2' then forms a cup, internal and/or upper face 4' forms cooking surface 3' and other external and/or lower face 5' is mounted on the device. Handle 9' may be attached to holder 2' by, in particular, overmolding or clipping. Handle 9' may be made, inter alia, of plastic. However, a household appliance including cooking device 1' is not necessarily a raclette maker with trays, but could also be, in particular, a device with a cooktop such as a plancha or an electrical cooker with a vessel for browning food. Cooking device 1' may or may not be removable from the device. If desired, the heating mechanism may be part of holder 2'; external and/or lower other face 5' is not necessarily located next to a heat source.

The invention also relates to culinary articles and household cooking appliance with such as cooking device 1; 1'.

Specifically, in accordance with the invention, metallic holder 2; 2' forms a substrate supporting boride or transition metal boronitride surface layer 10; 10' which forms cooking surface 3; 3'.

The term "transition metal boride" is not limited to stoichiometric compounds with a boron atom and a transition metal atom, but includes, inter alia, transition metal diborides. The transition metal is preferably titanium, chromium, zirconium, vanadium, niobium or iron. Transition metal borides such as titanium, chromium, zirconium, vanadium and niobium are diborides.

The term "transition metal boronitrides" is not limited to stoichiometric compounds containing one boron atom and one nitrogen atom for each transition metal atom, but includes, inter alia, boronitrides such as TiAlBN.

In other words, metallic holder 2; 2' forms substrate supporting surface layer 10; 10' made of transition metal boride or transition metal boronitride which forms cooking surface 3; 3'.

Metallic holder 2; 2' is advantageously made of stainless steel, titanium, or a multilayered material containing at least one external stainless steel face, e.g., a stainless steel/aluminum/stainless steel sandwich material.

The thickness of metallic holder 2; 2' is advantageously between several tenths of a millimeter and several millimeters.

In accordance with an initial embodiment, surface layer 10 is made of a boride or transition metal boronitride coating. The transition metal boride coating is deposited on a substrate formed by metallic holder 2; 2'.

In other words, surface layer 10 is formed by a transition metal boride or transition metal boronitride coating.

Coating techniques may, in particular, apply to cooking devices 1; 1' made of materials which have limited heat retention, e.g., heat distribution wall 7 attached to holder 2; handle 9' of holder 2' is preferably attached after surface layer 10 has been deposited.

Transition metal boride coatings as $TiB_2$, $CrB_2$, FeB, $Fe_2B$, $VB_2$, $NbB_2$ or $ZrB_2$ are known for their properties of hardness, resistance to wear, tear and corrosion, and thermal stability.

Multiple processes make it possible to deposit thin layers of transition metal borides such as $TiB_2$, $CrB_2$, FeB, $Fe_2B$, $VB_2$, $NbB_2$ or $ZrB_2$. The coating may be completed by, inter alia, physical vapor deposition on internal and/or upper face 4; 4' of holder 2; 2', or by plasma-assisted, vapor phase chemical deposition on internal and/or upper face 4; 4' of holder 2; 2'.

Among the physical vapor deposition (PVD) techniques, pulsed or non-pulsed direct current magnetron sputtering seems the most appropriate method to deposit such coatings because it allows deposits to be made at low temperatures (under 200° C.) on components that could have relatively complex shapes without using toxic gas. The deposits created are thick and adhere to the substrate. Further, substrate surface topography is retained.

Transition metal boride deposits are created using a target with the same composition as that of the coating used; the target that may be created by powder sintering. After forming an open space into the container, the film is created by non-reactive sintering with the target in an argon atmosphere. Deposit speeds of several μm/h can be achieved using this technique.

Other processes can be used to create transition metal boride coatings, e.g., radiofrequency sputtering, diborane reactive sputtering, or even ion beam sputtering. However, the deposit speeds achieved using these techniques are inferior to the speeds achieved with magnetron sputtering.

The coating could also be created by cathodic arc evaporation on internal and/or upper face 4; 4' of holder 2; 2'.

Plasma-assisted, vapor phase chemical deposits may also be used to deposit transition metal boride coatings at relatively low temperatures (approximately 400° C.). For example, for a thin layer of $TiB_2$, $BCl_3$, $TiCl_4$ or $Ti(BH_4)_4$ can be used. This process may thereby allow stoichiometric deposits with properties close to those obtained using PVD.

Test deposits have been developed using the PVD technique, by using continuous-current, pulsed magnetron sputtering. The substrate used was austenitic stainless steel (e.g., stainless steel 304). The target used has the same composition as the desired coating and is obtained by, e.g., powder sintering. The target is made of, e.g., $CrB_2$ or $TiB_2$. After forming pushing an open space into the container, surface layer 10 is created by non-reactive pulverizing in an argon atmosphere.

In one variation, deposits may be created by co-pulverization of a target metallic X and a target $B_4C$ (where X is a transition metal or a metal alloy of a transition metal such as TiAl, TiCr, ZrNb, etc.). Surface layer 10 then contains traces of carbon.

Transition metal boride coatings have a high hardness value (>2000 HV). To achieve satisfactory scratch resistance, a substrate with a minimum hardness of 150 HV must be used. Accordingly, a ferritic stainless steel substrate (≈160 HV), austenitic stainless steel (≈210 HV) or titanium (>160 HV) may be used for this invention. The substrate may include aluminum, but not as the coating support layer as aluminum hardness (50 to 90 HV) is too low to achieve the desired properties. Accordingly, metallic holder 2; 2' has a hardness greater than or equal to 150 HV.

Scratch resistance is assessed using an abrasive pad similar to green Scotch Brite® pads (impregnated with alumina particles).

To achieve a coating which is completely scratch resistant in accordance with the aforementioned test, the coating must have strong hardness and a minimum coating thickness of 2.5 μm. Increased coating thickness, e.g., exceeding 10 μm, is not necessary because the boride deposits are restricted and tend to crack. A coating thickness between 3 and 5 μm, e.g., 4 μm, provides satisfactory results.

An NbN or NbAlN coating with a hardness of approximately 15 GPa has sufficient hardness to ensure scratch resistance. The hardness of ditransition metal borides such as $CrB_2$, $TiB_2$, or $ZrB_2$ is even higher. Based on the aforementioned test, deposits applied to an austenitic stainless steel substrate show coating resistance equivalent to that of $CrB_2$ or $TiB_2$.

Ease-of-cleaning tests were conducted using the following protocol: the surface to be assessed was covered with a mixture of food with a strong tendency to stick after carbonization. The carbonized mixture was then subject to cleaning using an abrasive pad.

The food mixture consisted, for example, of the following: 34 mg/ml of glucose, 14.5 mg/ml of amylopectine, 39 mg/ml of ovalbumine, 13.5 mg/ml of casein, and 32.8 mg/ml of linoleic acid. After cooking in an oven for 20 min at 210° C. and cooling for 2 min, the sample was immersed in a mixture of water and detergent for 5 min, then cleaned with a plynometer (a device to abrade cooking residue). The percentage of surface area still covered by cooking residue was quantified to assign an ease-of-cleaning value to the cooking surface, where a 0 percentage corresponds to the cooking surface that is easiest to clean.

The table below shows the ease of cleaning values for various types of cooking surface 3; 3': stainless steel, NbN, NbAlN (with 59% atomic Al) and $CrB_2$ coatings.

| Cooking surface material | % of the remaining surface area covered by cooking residue after cleaning | Standard deviation |
|---|---|---|
| Stainless steel | 80 | 10 |
| NbN | 91 | 5 |
| NbAlN 59% Al | 37.85 | 20 |
| $CrB_2$ | 3.5 | 5 |

The $CrB_2$ coating appears to allow greater ease of cleaning compared to a stainless steel cooking surface or to a NbN or NbAlN coating.

A similar test with another mixture (milk+rice) confirmed these ease-of-cleaning results using transition metal boride coatings.

Adhesion tests during cooking were conducted in a frying pan in accordance with the following protocol: the frying pan was preheated for 1:30 min with 20 ml of oil on a gas stove 40 mm from the flame, after which time diced, firm Charlotte potatoes were added, and stirred every two minutes, before approximate sticking properties were determined.

The following results were obtained: for stainless steel and NbN, some residue after cooking and prior to cleaning (no significant differences in terms of sticking); for NbAlN, medium sticking; for $CrB_2$ and $TiB_2$, no residue after cooking. Further it was noticed that the polymerized oil was easily removed from $CrB_2$ and $TiB_2$.

Cooking device 1; 1' with a coating consistent with the invention is significantly easier to clean than a stainless steel cooking surface and, further, demonstrated improved scratch resistance compared to a stainless steel cooking surface.

In one variation, XBN-type transition metal boronitride deposits, e.g., TiBN or TiAlBN, may be created several different ways, for example, either directly from a target XBN, where surface layer 10 is created by non-reactive pulverizing in an argon atmosphere, or from a target XB or $XB_2$, where surface layer 10 is deposited under reactive conditions. The boronitrides produce a color unlike that of stainless steel, for example, dark grey or anthracite for TiBN.

In accordance with a second embodiment, surface layer 10; 10' is an iron or titanium boride conversion layer. The conversion layer is created by thermochemical boride diffusion on a metallic substrate formed by holder 2; 2'. Such an embodiment appears well suited for holder 2' of cooking device 1' prior to attaching handle 9', but may also be envisaged for holder 2 of cooking device 1 if heat-diffusing bottom 6 with aluminum heat distribution wall 7 is not present.

Thermochemical diffusion processes such as boriding increase the surface area of a boron component. These processes usually take place at between 800 and 1,000° C. Homogenous layers of strongly adherent borides are thereby formed on the surface. Different processes can be used for such treatments. In a gas environment, boron gas sources are boron halogens or boranes. In a liquid environment, with melted salts, with or without electrolysis, or in an aqueous borax solution. In a solid environment, using a pack cementation method, in which the components are placed in a cement consisting of powder and boron carbide-based granules with which a fluoroborate, which acts as an enhancer, is mixed. The temperature (approximately 900° C.) and processing time depend on the desired thickness of the borided area. Typically, the thickness of the borided layers varies between 10 and 300 μm. The hardness achieved depends on the material used. One of the most common applications uses ferrous alloys (in particular, stainless steels) the hardness of which may reach 1600 to 2000 HV. It is also possible to complete thermochemical boride treatment on metals such as titanium (forming a titanium boride layer which may reach 4000 HV) or nickel-based alloys (up to 2800 HV).

The invention also covers a process for creating cooking device 1, including the following steps:
- supply or completion of metallic holder 2; 2' with hardness greater than or equal to 150 HV,
- creation of surface layer 10; 10' out of boride or transition metal boronitride on face 4; 4' of metallic holder 2; 2', to form cooking surface 3; 3'.

In other words, the invention also covers a process for creating cooking device 1, including the following steps:
- supply or completion of metallic holder 2; 2' with hardness greater than or equal to 150 HV,
- creation of surface layer 10; 10' out of transition metal boride or transition metal boronitride on face 4; 4' of metallic holder 2; 2', to form cooking surface 3; 3'.

In accordance with the first embodiment, the process consists of depositing a boride or transition metal boronitride coating on face 4; 4' of holder 2; 2'.

In other words, in accordance with the first embodiment, the process consists of depositing a transition metal boride or transition metal boronitride coating on face 4; 4' of holder 2; 2'.

In accordance with the second embodiment, the process consists of depositing an iron or titanium boride conversion layer using thermochemical boride diffusion on face 4; 4' of holder 2; 2'.

Accordingly, cooking surface 3; 3' formed by surface layer 10; 10' made of boride or transition metal boronitride is placed on a substrate which is sufficiently hard to give cooking surface 3; 3' good scratch resistance. The thickness of surface layer 10; 10' is preferably at least equal to 2 μm, and may reach 300 μm for a conversion layer.

This invention is not in any manner limited to the embodiments described, but includes many other modifications within the framework of the claims.

The invention claimed is:

1. A cooking device comprising a metallic holder supporting a ceramic cooking surface, where the holder has a hardness greater than or equal to 150 HV, wherein the metallic holder forms a substrate supporting a surface layer of transition metal boronitride forming the cooking surface, and wherein the surface layer is formed by a transition metal boronitride coating that provides a different color than that of stainless steel, and
   wherein the transition metal boronitride coating is directly deposited on the metallic holder.

2. Cooking device in accordance with claim 1, wherein the surface layer has a thickness of at least 2 μm.

3. Cooking device in accordance with claim 1, wherein the metallic holder is made of stainless steel, titanium, or a multilayered material containing at least one external stainless steel face.

4. Cooking device in accordance with claim 1, wherein the transition metal used is titanium, chromium, zirconium, vanadium, niobium or iron.

5. Cooking device in accordance with claim 1, wherein the metallic holder has a face supporting the cooking surface and another face opposite the face supporting the cooking surface.

6. A cooking appliance comprising a cooking device according to claim 1, wherein the metallic holder includes internal and/or upper face forming the cooking surface and another external and/or lower face designed to be placed next to a heat source.

7. A household cooking appliance comprising a cooking device according to claim 1, wherein the metallic holder includes an internal and/or upper face forming the cooking surface and another external and/or lower face on said device.

8. A cooking device comprising a metallic holder supporting a ceramic cooking surface, where the holder has a hardness greater than or equal to 150 HV, wherein the metallic holder forms a substrate made of iron and/or titanium and the substrate provides a surface layer made of iron boride conversion layer and/or titanium boride conversion layer, and wherein the conversion layer forms the cooking surface.

9. Cooking device in accordance with claim 8, wherein the surface layer has a thickness of at least 2 μm.

10. Cooking device in accordance with claim 8, wherein the metallic holder has a face supporting the cooking surface and another face opposite the face supporting the cooking surface.

11. A cooking appliance comprising a cooking device according to claim 8, wherein the metallic holder includes internal and/or upper face forming the cooking surface and another external and/or lower face designed to be placed next to a heat source.

12. A household cooking appliance comprising a cooking device according to claim 8, wherein the metallic holder includes an internal and/or upper face forming the cooking surface and another external and/or lower face on said device.

13. A process to manufacture a cooking device comprising the following steps:

supply or completion of a metallic holder with a hardness greater than or equal to 150 HV, addition of a transition metal boronitride surface layer directly to a face of the metallic holder, to form a cooking surface, wherein the addition step consists of depositing a transition metal boronitride coating on the face of the metallic holder that provides a different color than that of stainless steel.

14. Process to manufacture a cooking device in accordance with claim 13, wherein the metallic holder is made of stainless steel or titanium, or a multilayered material containing at least one external stainless steel face.

15. Process to manufacture a cooking device in accordance with claim 13, wherein the transition metal used is titanium, chromium, zirconium, vanadium, niobium or iron.

16. Process to manufacture a cooking device in accordance with claim 13, wherein the coating on said face of the metallic holder is achieved by vapor phase physical deposition.

17. Process to manufacture a cooking device in accordance with claim 16, wherein the depositing is carried out using direct current magnetron sputtering.

18. Process to manufacture a cooking device in accordance with claim 13, wherein the coating on said face of the metallic holder is achieved by plasma-assisted chemical vapor deposition.

19. A process to manufacture a cooking device comprising the following steps:

supply or completion of a metallic holder with a hardness greater than or equal to 150 HV, said metallic holder forming a substrate made of iron and/or titanium, achieving a surface layer on a face of the metallic holder, to form a cooking surface, wherein the surface layer consists of an iron boride conversion layer or titanium boride conversion layer achieved using thermochemical boride diffusion on said face of the metallic holder, wherein said conversion layer forms the cooking surface.

20. Process to manufacture a cooking device in accordance with claim 19, wherein the metallic holder is made of stainless steel or titanium, or a multilayered material containing at least one external stainless steel face.

* * * * *